United States Patent [19]
Persico et al.

[11] Patent Number: 5,596,299
[45] Date of Patent: Jan. 21, 1997

[54] IF AMPLIFIER/LIMITER WITH POSITIVE FEEDBACK

[75] Inventors: Charles J. Persico, San Diego; Nasrollah S. Navid, Saratoga, both of Calif.; Ali Fotowat-Ahmady, Tehran, Islamic Rep. of Iran

[73] Assignee: Philips Electronics North America Corporation, New York, N.Y.

[21] Appl. No.: 453,408

[22] Filed: May 30, 1995

[51] Int. Cl.⁶ .................................................. H03F 3/45
[52] U.S. Cl. ........................... 330/260; 330/252; 455/308
[58] Field of Search ..................................... 330/156, 252, 330/260; 455/210, 308

[56] References Cited

U.S. PATENT DOCUMENTS 4,904,952  2/1990  Tanimoto ................................ 330/252

FOREIGN PATENT DOCUMENTS 1319174  1/1963  France ..................................... 330/252
2230155  10/1990  United Kingdom .................... 330/252

Primary Examiner—James B. Mullins
Attorney, Agent, or Firm—Steven R. Biren

[57] ABSTRACT

An IF limiting amplifier uses localized positive feedback in each amplifier stage to provide additional small signal gain while maintaining the limiting gain. The extra small signal gain results in higher overall sensitivity for the receiver at less bias current. The reduction in the number of stages needed to perform the same signal response results in a significant decrease in power consumption by the circuit.

10 Claims, 10 Drawing Sheets

5,596,299

IF AMPLIFIER/LIMITER WITH POSITIVE FEEDBACK

BACKGROUND OF THE INVENTION

1. Field of the Invention

The present invention relates to IF amplifiers/limiters. More particularly, it relates to an IF amplifier/limiter with local positive feedback in each stage for improved sensitivity.

2. The Prior Art

A typical multiple stage IF amplifier/limiter uses a feedback loop to stabilize the circuit from a DC source. This provides large gain for small input signals and controlled limiting for larger input signals. IF amplifier/limiter circuits such as this are used in FM radios, analog cellular phones and cordless telephones.

SUMMARY OF THE INVENTION

The present invention provides an IF amplifier/limiter circuit that utilizes localized positive feedback in each stage to provide additional small signal gain while maintaining the limiting gain for larger signals.

According to the invention, localized positive feedback is introduced into the first differential amplifier pair by adding a second differential pair of transistors to the circuit. The second differential pair is coupled to the output of the first differential pair in a crossed configuration. Additional resistors are added to the circuit to adjust the amount of positive feedback introduced into the gain block of the first differential pair, as well as to adjust the range of linearity of the extra small signal gain.

It is therefore an object of the present invention to provide an IF amplifier/limiter which produces an increased small signal gain for smaller input signals while maintaining the limiting gain for larger input signals.

It is another object of the invention to provide an IF amplifier/limiter which uses localized positive feedback in each stage.

Yet another object of the invention is to provide an IF amplifier/limiter that has more overall sensitivity for a receiver at less bias current.

It is a further object of the invention to provide an IF amplifier/limiter that requires a significantly reduced amount of power to provide the same signal response.

It is yet another object of the invention to provide an IF amplifier/limiter that operates reliably and efficiently.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views:

FIG. 1b is a single stage of the prior art IF circuit of FIG. 1a;

FIGS. 8b and 8c are the input source circuits used during simulation for the circuit of FIG. 8a;

FIG. 9 is a graphical representation of the DC transfer function of the circuit of FIG. 8a;

FIGS. 10b and 10c are the input source circuits used during simulation for the circuit of FIG. 10a;

FIG. 11 is a graphical representation of the DC transfer function of the circuit of FIG. 10a.

DETAILED DESCRIPTION OF PREFERRED EMBODIMENTS

Figure 1A:
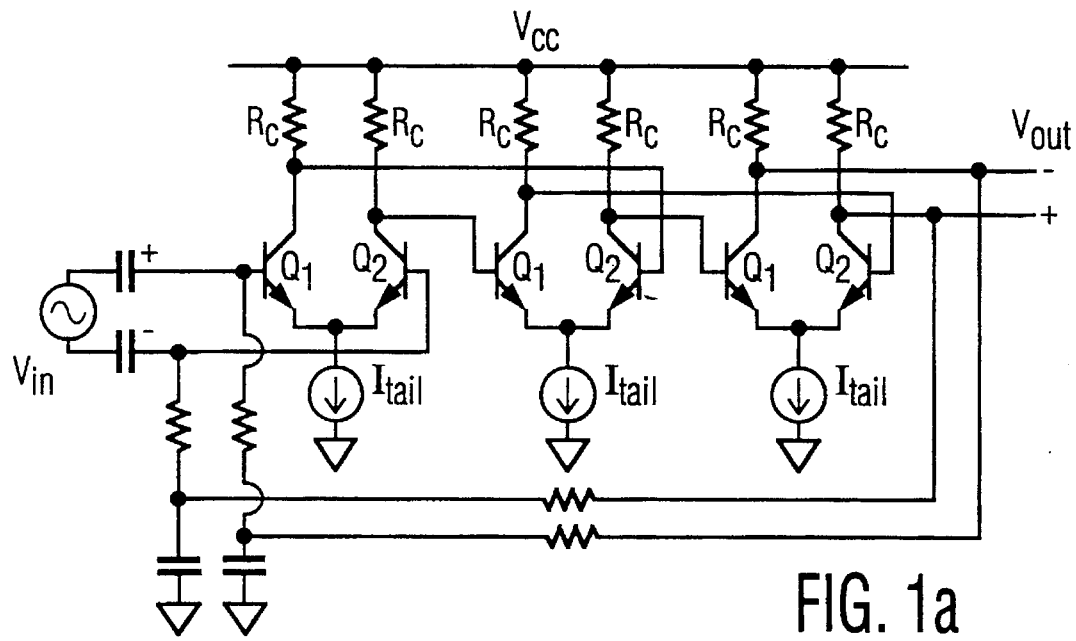
FIG. 1a is a typical IF cicruit of the prior art.

Turning now in detail to the drawings, FIG. 1a shows the standard circuit implementation for an IF limiting amplifier of the prior art. The feedback loop of the circuit stabilizes the circuit and allows large gain for small input signals and controlled limiting for larger input signals. Due to the low frequency feedback loop, all nodes of the circuit are biased at ($V_{cc}$−0.5 $I_{tail}R_c$). At very high frequencies, the DC loop is open and the full gain of all differential amplifier stages will be multiplied. In this mode, the gain of each stage is given approximately by:

$$A_d = \frac{I_{tail}R_C}{2V_t} \quad (1)$$

where, $$V_t = \frac{kT}{q}$$

Figure 1B:
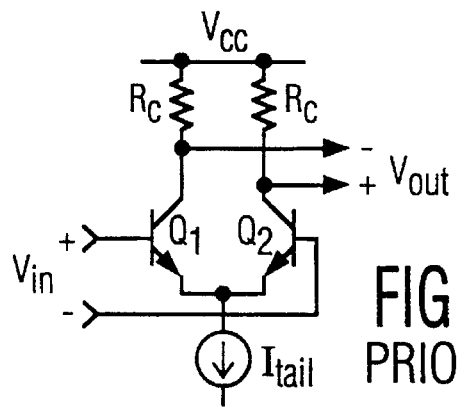

As the signal builds up, the last amplifier stage limits first when all of its tail current is diverted to one side, thereby making the maximum differential swing at its output equal to ($R_cI_{tail}$). FIG. 1b shows a single stage of the prior art limiting amplifier shown in FIG. 1a. Each stage contains a first differential pair of transistors $Q_1$ and $Q_2$. The emitter of $Q_1$ is coupled to the emitter of $Q_2$ and both are coupled to a current source $I_{tail}$. The collector of $Q_1$ is connected to a voltage source ($V_{cc}$) through a resistor $R_{C1}$. The collector of $Q_2$ is connected to the voltage source ($V_{cc}$) through resistor $R_{C2}$. The base of each of the transistors $Q_1$ and $Q_2$ receive the positive or negative portion of the input signal.

Figure 2:
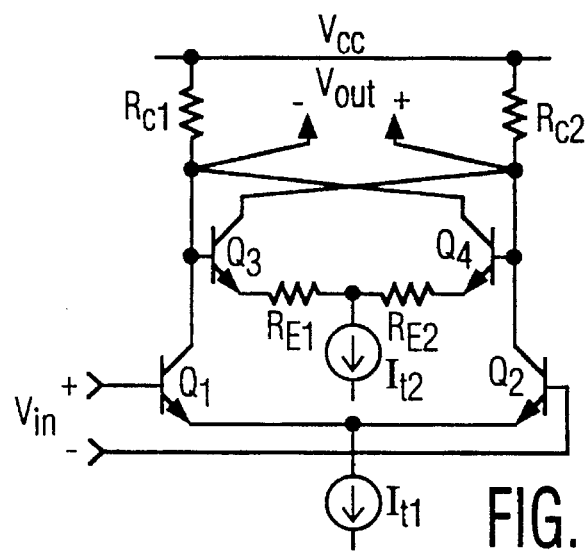
FIG. 2 is a first embodiment of an IF amplifier/limiter with local positive feedback according to the invention.

FIG. 2 shows the new limiting IF amplifier circuit according to the invention. The new circuit utilizes localized positive feedback by including a second differential pair of transistors, $Q_3$ and $Q_4$, and resistors $R_{E1}$ and $R_{E2}$ coupled to the emitter outputs of $Q_3$ and $Q_4$, respectively. As shown, $Q_3$ and $Q_4$ have their collectors cross coupled to achieve the localized positive feedback. The base of $Q_3$ and the collector of $Q_4$ are connected to the collector of $Q_1$. The base of $Q_4$ and the collector of $Q_3$ are connected to the collector of $Q_2$. Resistor $R_{E1}$ is connected at one end to the emitter output of $Q_3$ and at the other end to a current source $I_{t2}$. Resistor $R_{E2}$ is connected at one end to the emitter output of $Q_4$ and at the other end to resistor $R_{E1}$ and current source $I_{t2}$.

The incorporation of positive feedback into the IF amplifier/limiter of the prior art significantly increases the small signal gain over that of a standard differential pair, without requiring any increase in current consumption. The small signal gain is defined as:

$$A_d = \frac{V_{out}}{V_\epsilon}$$

The localized positive feedback allows fewer stages of the FIG. 2 circuit implementation over the FIG. 1b implementation to achieve the same overall circuit gain. This reduction in the number of stages needed to obtain a desired signal significantly reduces the current (power) consumption of the overall circuit. In some instances, the power consumption can be reduced up to 50%.

The amount of localized feedback introduced into the gain block of the first differential pair is controlled by the value of resistors $R_{C1}$ and $R_{C2}$.

Figure 3:
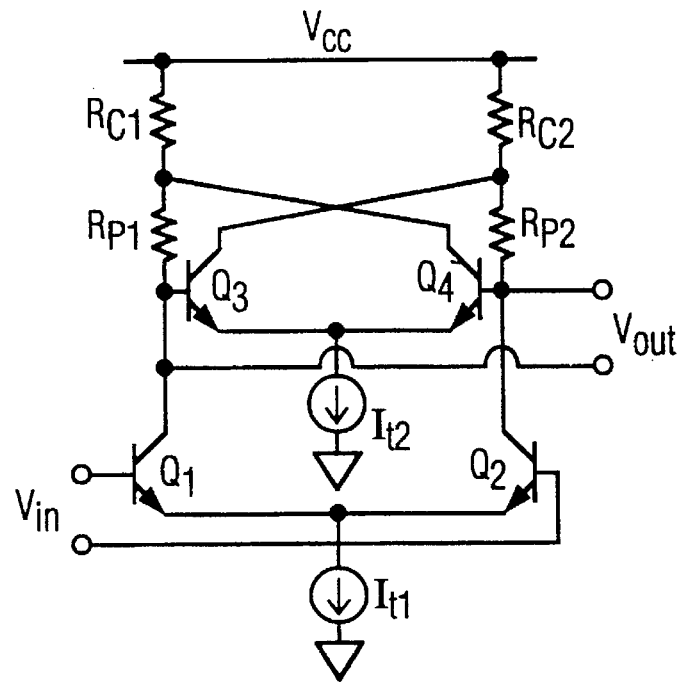
FIG. 3 is a second embodiment of an IF amplifier/limiter with local positive feedback according to the invention.

FIG. 3 shows a second embodiment of the IF amplifier/limiter with localized positive feedback. This implementation uses resistors $R_{P1}$ and $R_{P2}$ connected with the base of transistors $Q_3$ and $Q_4$, respectively, as an alternative way of controlling the amount of localized feedback introduced into the gain block of the first differential pair. In this configuration, resistors $R_{C1}$ and $R_{P1}$ are coupled in series to each other with the opposite end of $R_{P1}$ being connected to the collector of $Q_1$, and the opposite end of $R_{C1}$ connected to $V_{cc}$. Resistors $R_{C2}$ and $R_{P2}$ are connected in series with each other with the opposite end of $R_{P2}$ being connected to the collector of $Q_2$ and the opposite end of $R_{C2}$ connected to $V_{cc}$. Transistors $Q_3$ and $Q_4$ are connected in the same configuration as described in FIG. 2.

The resistors $R_{P1}$ and $R_{P2}$ are used to adjust the amount of positive feedback introduced in the first differential pair. Adjusting the ratio of values for resistors $R_{P1}$ and $R_{P2}$ allows the gain to increase and can even change its polarity. Thus, with this circuit, it is possible to theoretically achieve infinite small signal gain for a very small signal range.

Figure 4:
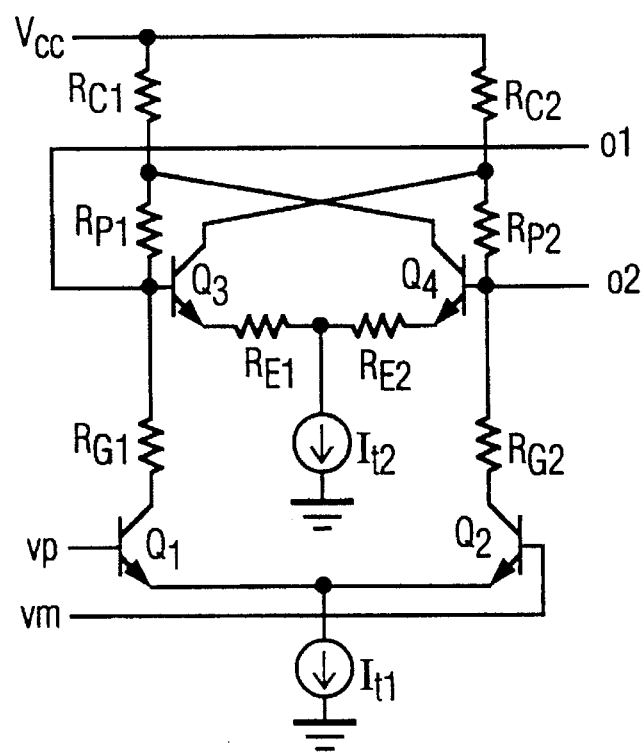
FIG. 4 is a universal IF amplifier/limiter building block with local positive feedback according to the invention.

To further increase the small signal linear range, additional resistors can be added to the collectors of $Q_1$ and $Q_2$ (see FIG. 4) to make the signal inputs into the positive feedback circuit smaller. The circuit of FIG. 4 shows a universal IF amplifier/limiter building block with local positive feedback. As shown, the resistors $R_{E1}$, $R_{E2}$, $R_{P1}$ and $R_{P2}$ are shown as described in FIGS. 2 and 3. Additional resistors $R_{G1}$ and $R_{G2}$ have been added to the circuit. Resistor $R_{G1}$ is connected at one end to the collector of $Q_1$ and connected in at the other end to resistor $R_{P1}$ and the base of $Q_3$. Resistor $R_{G2}$ is connected at one end to the collector of $Q_2$ and connected in at the other end to resistor $R_{P3}$ and the base of $Q_4$.

In this configuration, the values of resistors $R_{G1}$, $R_{G2}$, $R_{E1}$ and $R_{E2}$ can be used to adjust the range of linearity of the extra small signal gain, while the values of resistors $R_{C1}$, $R_{C2}$, $R_{P1}$ and $R_{P2}$ adjust the amount of positive feedback introduced into the gain block of the first differential pair, thereby affecting the small signal gain. In order to have the same large signal gain (limiting) as a standard limiter (FIG. 1b), while having the same current consumption, the following conditions should apply:

$$I_{t1} + I_{t2} = I_{tail} \qquad (2)$$

$$I_{t1}(R_{C_1} + R_{P_1} + R_{G_1}) + I_{t2}R_{G_1} = I_{tail}R_L \qquad (3)$$

The circuits of FIGS. 5a–5e have been generated with Spice™ circuit simulation software to show the performance of the IF amplifier/limiter of the invention, as compared with the IF amplifier/limiter of the prior art.

Figure 5A:
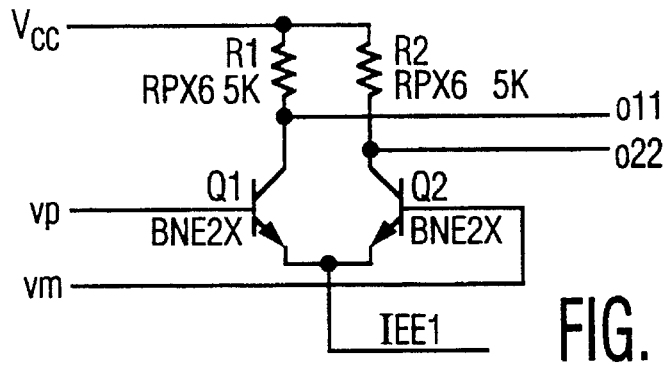
FIG. 5a is a standard IF amplifier stage of the prior art with specific values assigned to the circuit components for simulation.
Figure 5B:
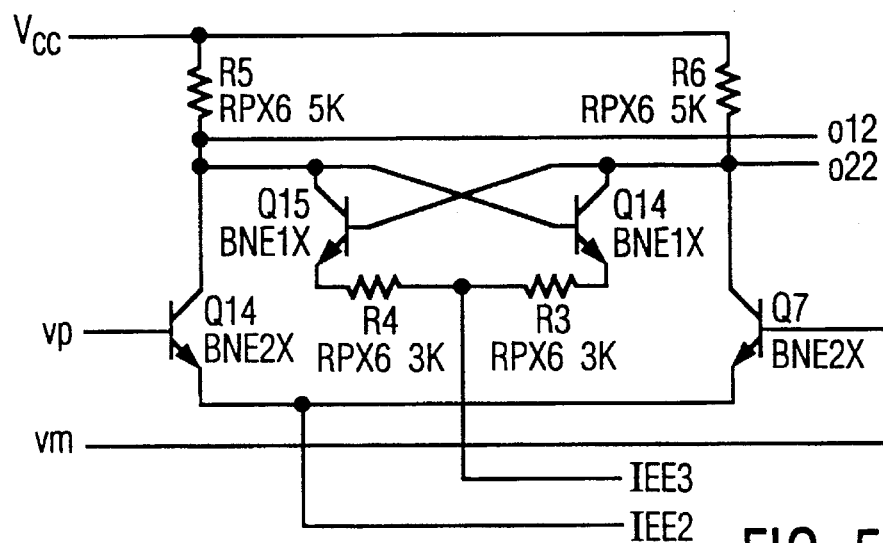
FIG. 5b is a modified version of the first embodiment of FIG. 2 with specific values assigned to the circuit components for simulation.
Figure 5C:
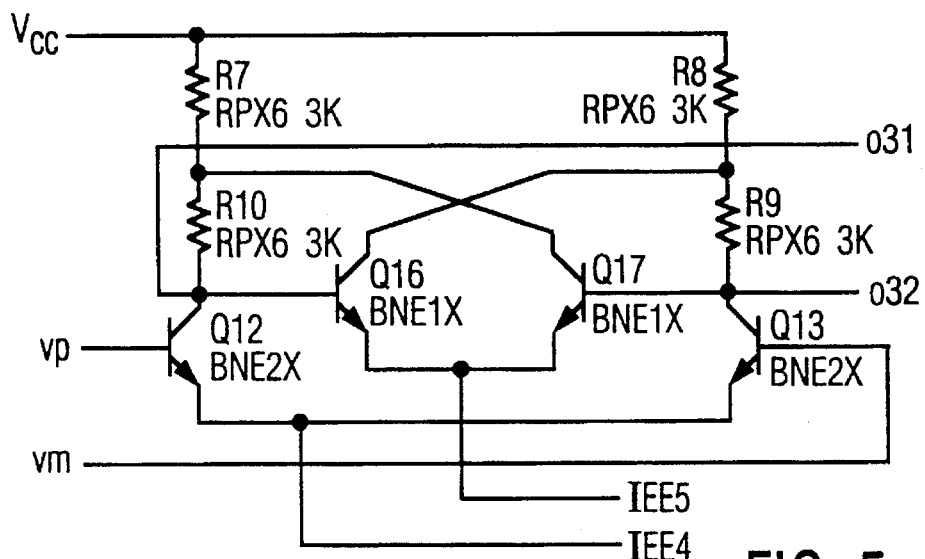
FIG. 5c is an example of the second embodiment of FIG. 3 with specific values assigned to the circuit components for simulation.

FIG. 5a is a standard IF limiting amplifier of the prior art, FIG. 5b is a modified circuit of the first embodiment of the invention shown in FIG. 2, and FIG. 5c is a modified circuit of the second embodiment of the invention. The circuit of FIG. 5b shows a different configuration of the transistors $Q_{14}$ and $Q_{15}$ of the second differential pair introduced into the circuit. The base of $Q_{14}$ is coupled with the collector of $Q_{15}$ and the collector of $Q_6$, and the base of $Q_{15}$ is coupled with the collector of $Q_{14}$ and the collector of $Q_7$.

Figure 5E:
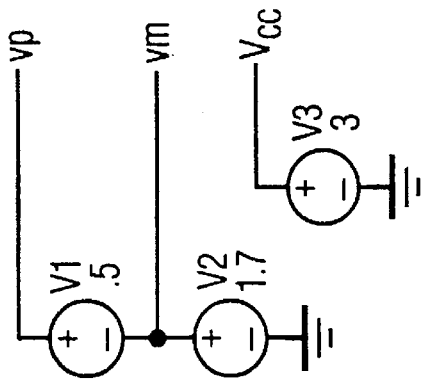
FIGS. 5d and 5e are the input source circuits used during simulation for the circuits of FIGS. 5a–5c.
Figure 5D:
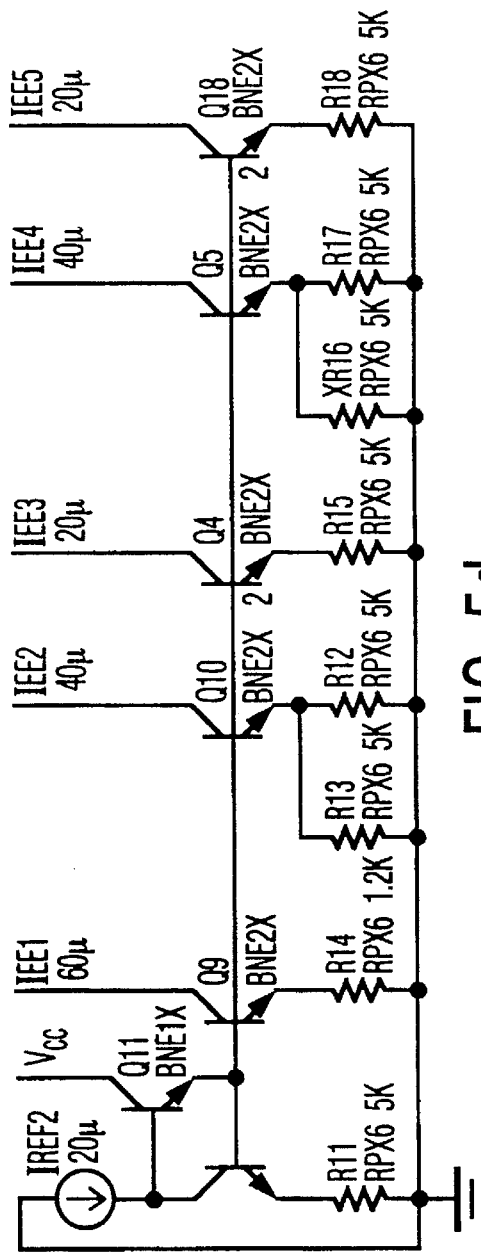

FIGS. 5d and 5e represent the input sources for the circuits of FIGS. 5a–5c during simulation. For purposes of the simulation, specific values have been assigned to the respective circuit elements to provide the examples of operation.

Figure 6:
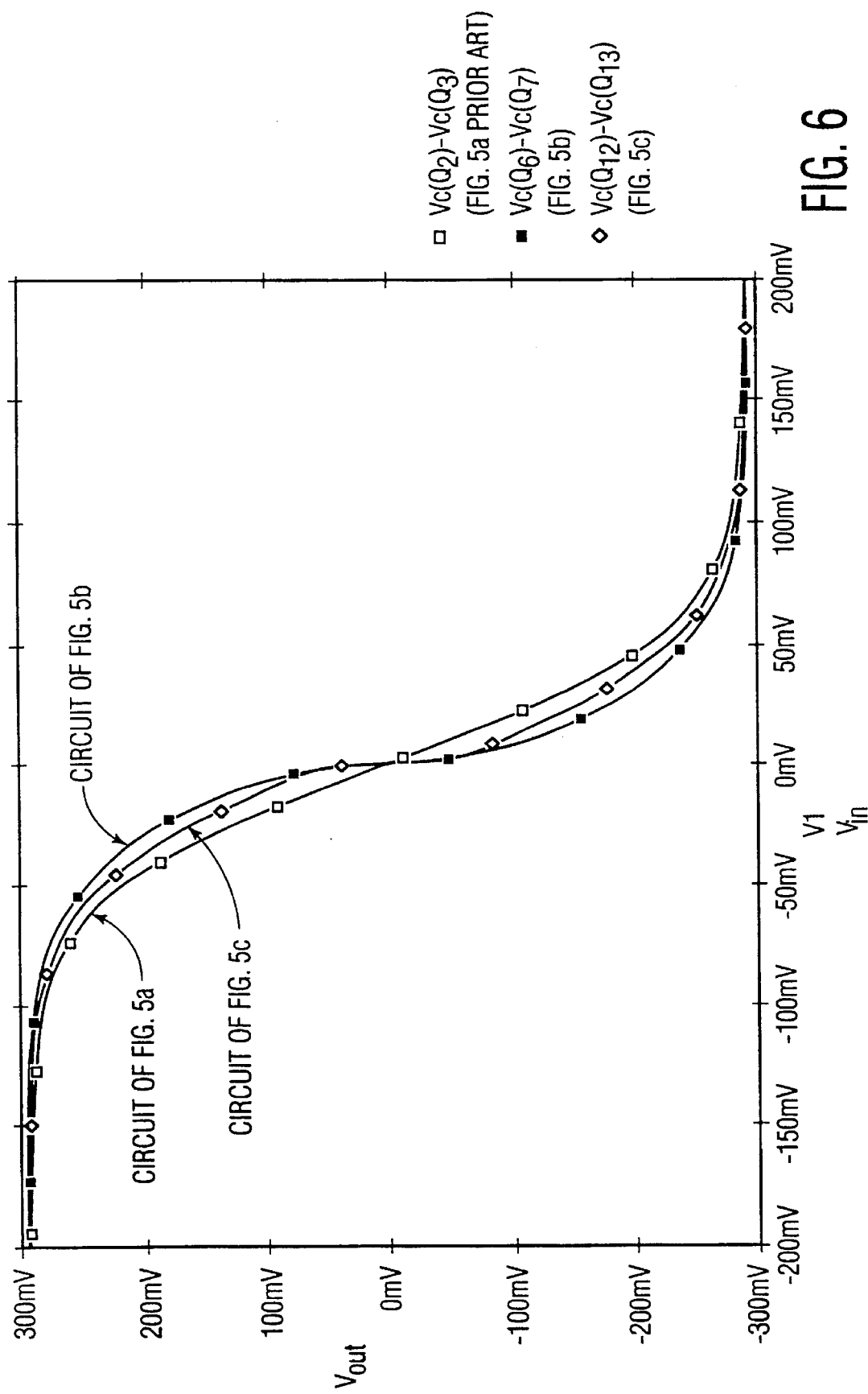
FIG. 6 is a graphical representation of the DC transfer ($V_{out}$ vs. $V_{in}$, where the slope is the gain of the circuit) function of the circuits of FIG. 5.
Figure 7:
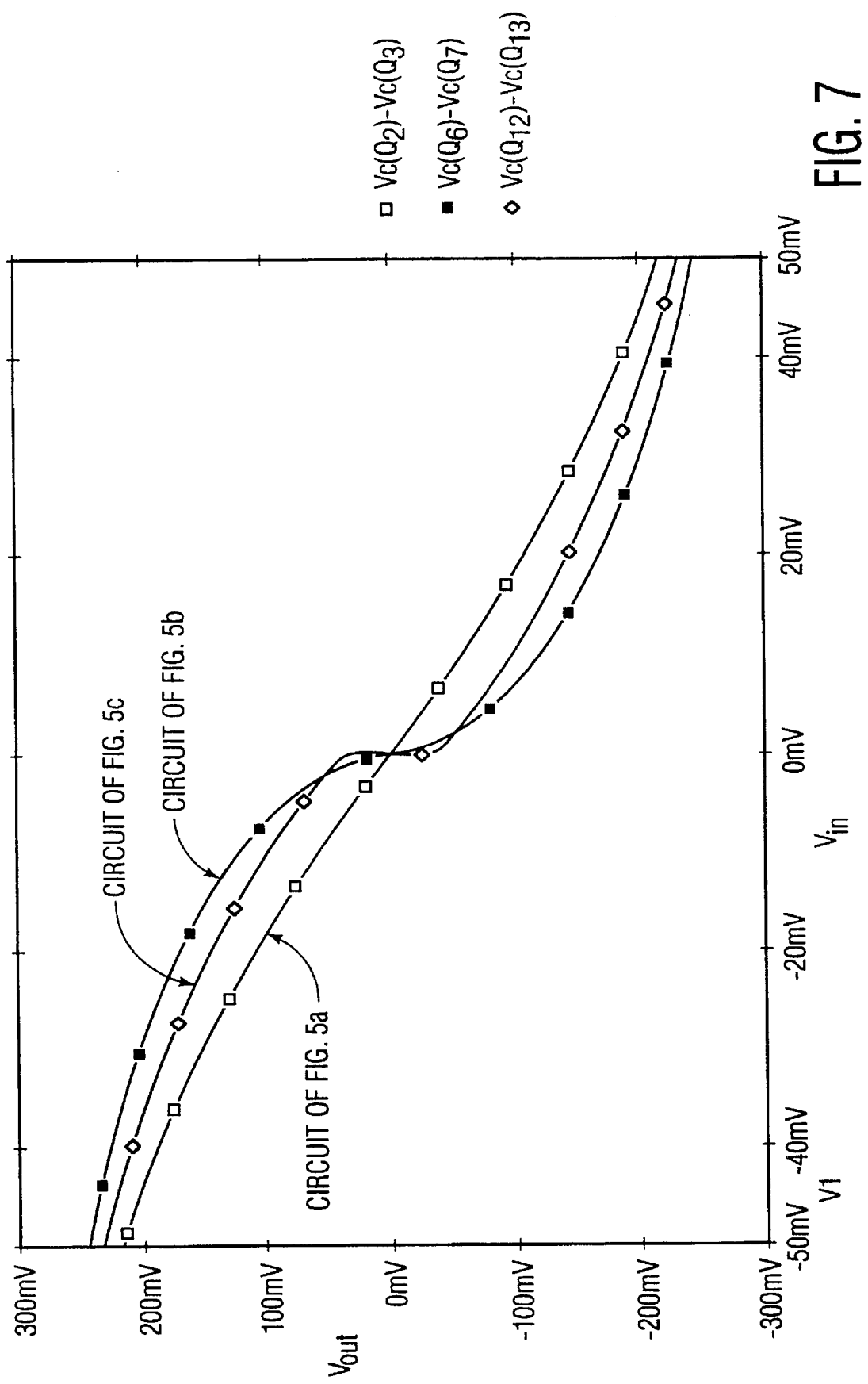
FIG. 7 is a graphical representation of the DC transfer function of the circuits of FIG. 5 with a smaller scale on the X-axis.

FIGS. 6 and 7 show a graphical representation of the DC transfer functions of the circuits shown in FIGS. 5a–5c. FIG. 6 shows the DC transfer function for a larger range of signals. As shown, the DC transfer function of the prior art circuit of FIG. 5a is represented by $Vc(Q_2)$-$Vc(Q_3)$ and is shown graphically by the open square legend. The DC transfer function of the circuit of FIG. 5b is represented by $Vc(Q_6)$-$Vc(Q_{-7})$, and is shown graphically by the solid square legend. The DC transfer function of the circuit of FIG. 5c is represented by $Vc(Q_{12})$-$Vc(Q_{13})$, and is shown graphically by the open diamond legend. It should be noted that all three circuits have the same full limiting gain, and exactly the same current consumption, but the circuit of FIG. 5b has more small signal gain and the circuit of FIG. 5c has the biggest small signal gain. FIG. 7 shows the DC transfer functions with a smaller range on the X-axis of −50 mV to +50 mV. The DC transfer function of the circuit of FIG. 5b shows the effect of the emitter degeneration on the signal gain, while the DC transfer signal of the circuit of FIG. 5c shows a substantially vertical slope at the OmV intersection, which indicates an almost infinite small signal gain.

Figure 8A:
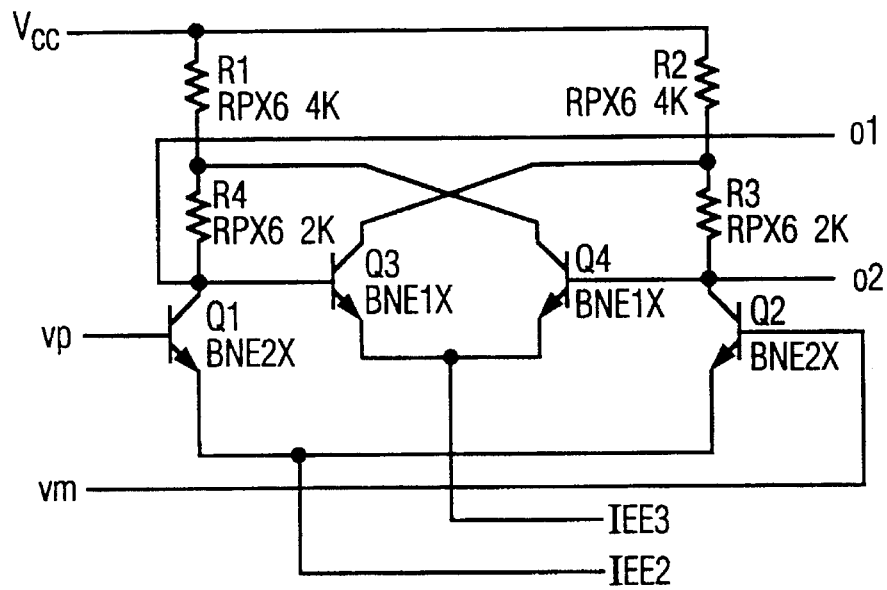
FIG. 8a is a modified embodiment of the circuit shown in FIG. 5c with different specific values assigned to the circuit elements for simulation.
Figure 8B:
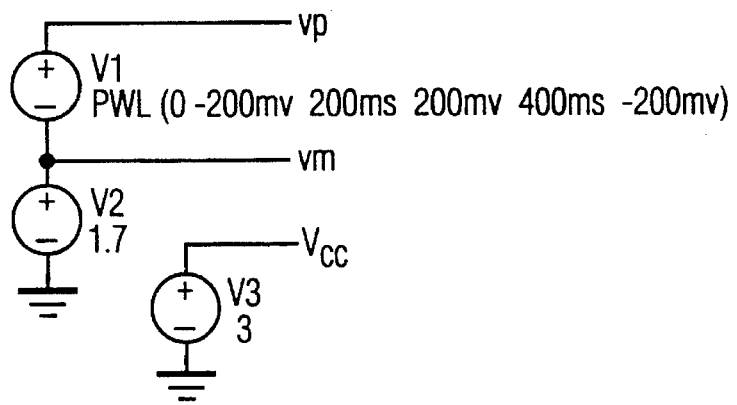
Figure 8C:
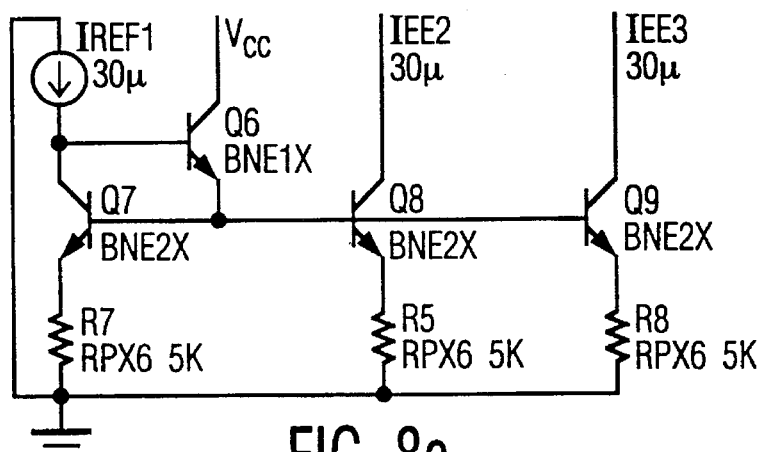

FIG. 8a shows another example of the circuit of FIG. 5c with different values assigned to the respective electrical components. FIGS. 8b and 8c represent the input signals for the circuit of FIG. 8a for purposes of the simulation.

Figure 9:
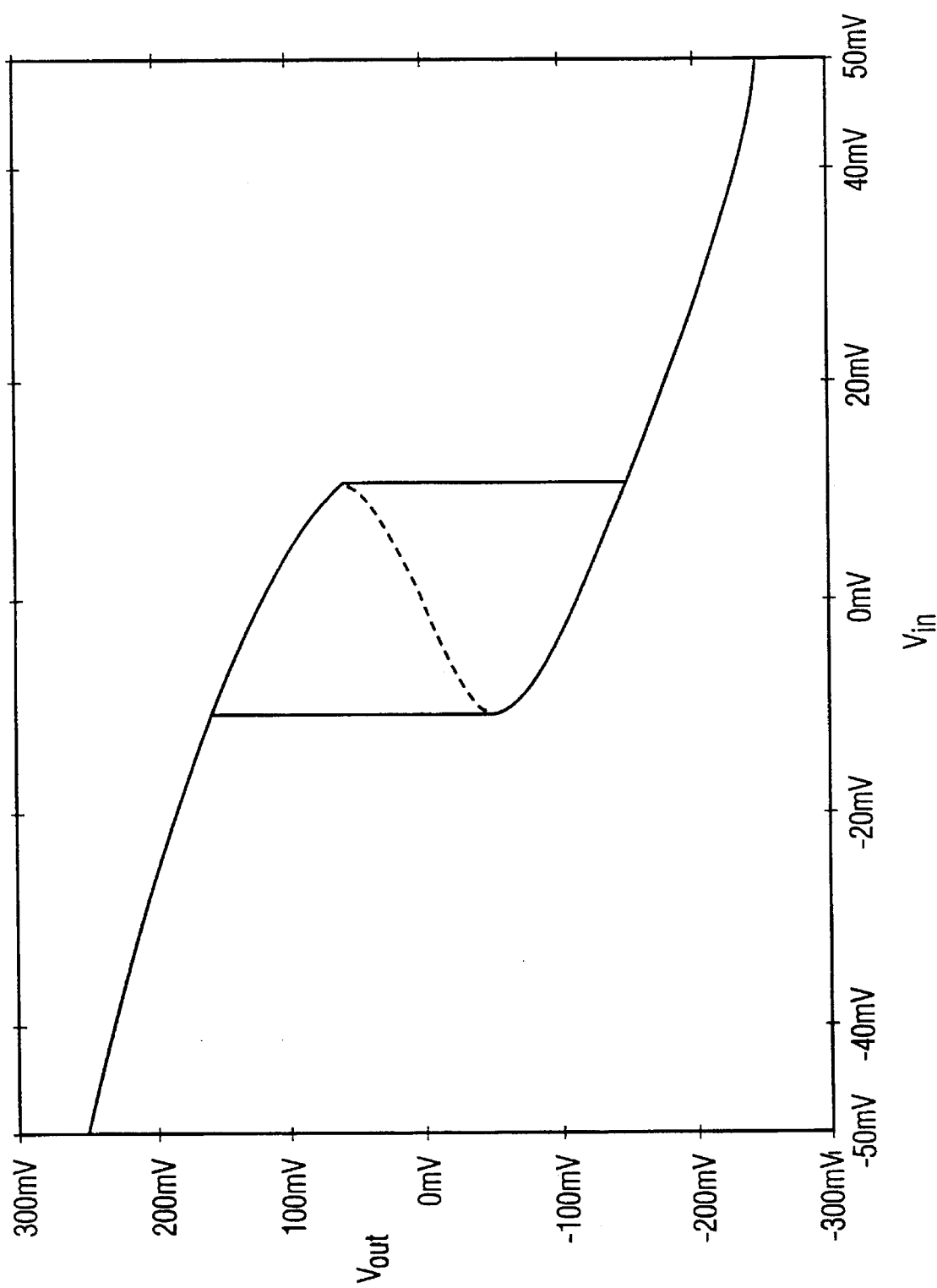

FIG. 9 shows a graphical representation of the DC transfer function of the circuit of FIG. 8a. The DC transfer function is represented by $Vc(Q_1)$-$Vc(Q_2)$. This simulation shows that by changing the value of the resistors R1–R4 in the circuit of FIG. 8a, it is possible to increase the positive feedback to the extent that a change in the polarity of the DC transfer function occurs.

Figure 10A:
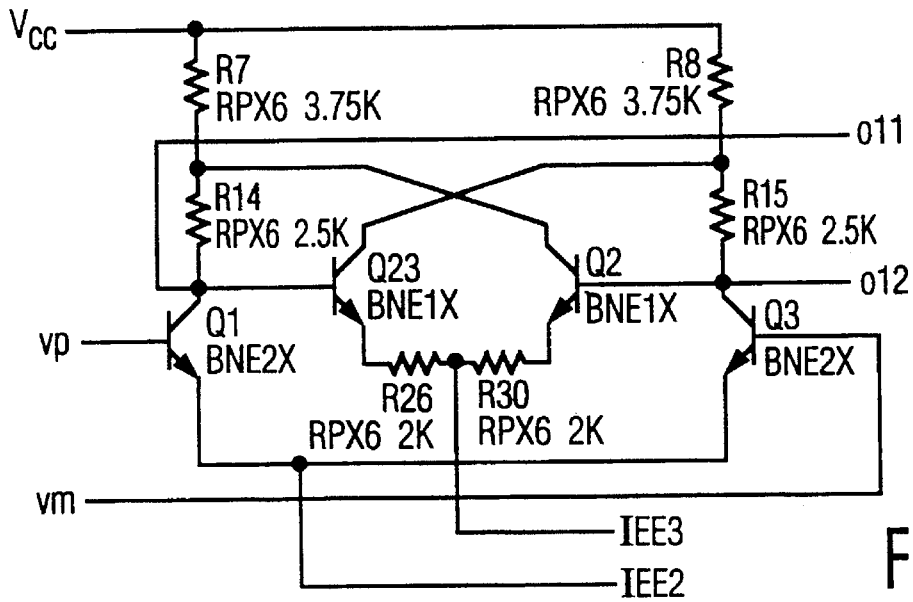
FIG. 10a is a third embodiment of an IF amplifier/limiter with local positive feedback according to the invention with specific values assigned to the circuit components for simulation.
Figure 10B:
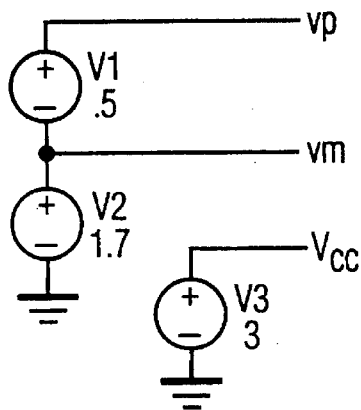
Figure 10C:
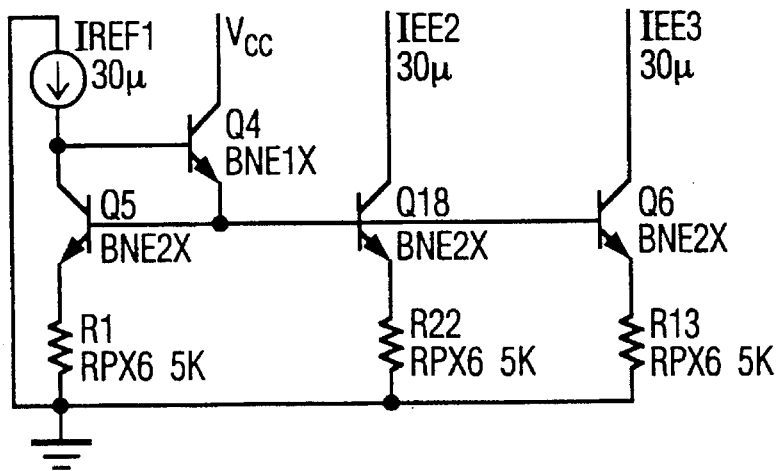
Figure 11:
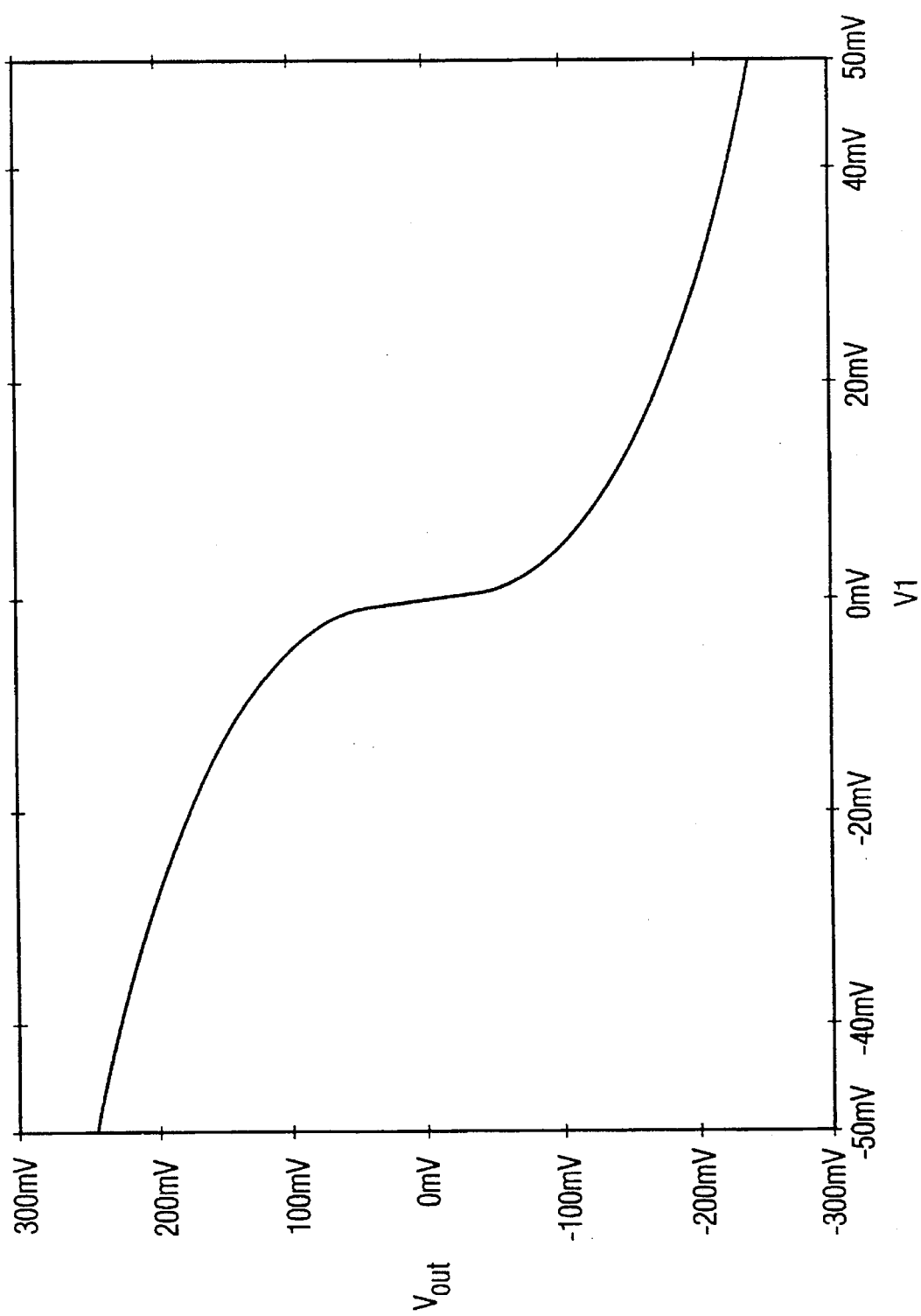

FIG. 10a shows an example of a modified version of the circuit of FIG. 5c. Specifically, the addition of resistors R26 and R30 coupled to the emitters of transistors $Q_{23}$ and $Q_2$, respectively. The circuit of FIGS. 10b and 10c represent the input signals used for the simulation. FIG. 11 shows a graphical representation of the DC transfer function of the circuit of FIG. 10a. The very steep slope of the curve at the 0Mv range indicates a very high gain for small input signals.

What is claimed is:

1. An IF amplifier/limiter circuit comprising:

a string of differential amplifier pairs and a low-frequency negative feedback coupling from an output of a last of said differential amplifier pairs back to an input of a first of said differential amplifier pairs, said first differential amplifier pair receiving an input signal and producing an output signal having a gain at its output;

resistor means connected to said first differential amplifier pair for controlling the amplitude of the gain of the output signal; and localized positive feedback means having its input connected to the output of said first differential amplifier pair for introducing a localized positive feedback into the output of said first differential amplifier pair to increase its gain.

2. The IF amplifier/limiter according to claim 1, wherein said first differential pair comprises:

a first transistor receiving an input signal at its base and having its emitter connected to a first current source; and a second transistor receiving an input signal at its base, and having its emitter connected to the emitter of said first transistor and the first current source.

3. The If amplifier/limiter according to claim 2, wherein said resistor means comprises:

a first resistor connected at one end to the collector of said first transistor and being connected at the opposite end to a voltage source ($V_{cc}$); and a second resistor connected at one end to the collector of said second transistor and being connected at its opposite end to the voltage source ($V_{cc}$), said first and second resistors controlling the amount of localized positive feedback introduced into said first differential pair.

4. The amplifier/limiter according to claim 3, wherein said feedback means comprises:

a third transistor having its base coupled to the collector of said first transistor, and its collector connected with the collector of said second transistor, and its emitter connected with a second current source;

a fourth transistor having its base connected to the collector of said second transistor, and its collector connected with the collector of said first transistor and its emitter connected with the emitter of said third transistor and the second current source, said third and fourth transistors defining a second differential pair; and adjustment means for controlling the amount of localized positive feedback introduced into the first differential pair, and for further adjusting the range of linearity of the output signal gain.

5. The amplifier/limiter according to claim 4, wherein adjustment means comprises:

a third resistor connected at one end to the emitter of said third transistor and connected at the opposite end to the second current source; and a fourth resistor connected at one end to the emitter of said fourth transistor and connected at the opposite end to the second current source, said third and fourth resistors for adjusting the range of linearity of the output signal gain.

6. The amplifier/limiter according to claim 4, wherein said adjustment means comprises:

a third resistor connected at one end to the base of said third transistor and the collector of said first transistor, and connected at the opposite end to said first resistor; and a fourth resistor connected at one end to the base of said fourth transistor and the collector of said second transistor, and connected at the opposite end to said second resistor, said third and fourth resistors for controlling the amount of localized positive feedback introduced into said first differential pair.

7. The amplifier/limiter according to claim 4, wherein said adjustment means comprises:

a third resistor connected at one end to the emitter of said third transistor and connected at the opposite end to the second current source;

a fourth resistor connected at one end to the emitter of said fourth transistor and connected at the opposite end to the second current source, said third and fourth resistors adjusting the range of linearity of the output signal gain;

a fifth resistor connected at one end to the base of said third transistor, and connected at the opposite end to said first resistor;

a sixth resistor connected at one end to the base of said fourth transistor, and connected at the opposite end to said second resistor, said fifth and sixth resistors controlling the amount of localized positive feedback introduced into said first differential pair;

a seventh resistor connected at one end to the collector of said first transistor and connected at the opposite end to said fifth resistor and the base of said third transistor; and an eighth resistor connected at one end to the collector of said second transistor and connected at the opposite end to said sixth resistor and the base of said fourth transistor, said seventh and eighth resistors adjusting the range of linearity of the output signal gain.

8. A method of increasing the sensitivity and reducing the power consumption of a IF amplifier/limiter circuit having a string of differential amplifier pairs and a low-frequency negative feedback coupling from an output of a last of said differential amplifier pairs back to an input of a first of said differential amplifier pairs, said first differential amplifier having a first differential pair of transistors, the method comprising:

introducing a positive localized feedback into the output of the first differential amplifier pair; and adjusting the amount of positive localized feedback introduced into the output of the first differential amplifier pair to obtain a desired output signal.

9. The method according to claim 8, wherein said step of introducing positive localized feedback is performed by adding a second differential pair of transistors coupled to an output of the first differential amplifier pair of the IF amplifier/limiter circuit.

10. The method according to claim 9, wherein said step of adjusting the amount of positive localized feedback introduced into the first differential amplifier pair is performed by selectively adding resistors to the first and second differential pairs of transistors.

* * * * *